US007006166B2

(12) United States Patent
Kim et al.

(10) Patent No.: US 7,006,166 B2
(45) Date of Patent: Feb. 28, 2006

(54) LIQUID CRYSTAL DISPLAY HAVING A MEMBER FOR PREVENTING ELECTRICAL SHORTING

(75) Inventors: Jeom Jae Kim, Seoul (KR); Gue Tai Lee, Yongchon-shi (KR); Cheol Woo Park, Taegu-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 116 days.

(21) Appl. No.: 09/891,535

(22) Filed: Jun. 27, 2001

(65) Prior Publication Data

US 2002/0085135 A1 Jul. 4, 2002

(30) Foreign Application Priority Data

Dec. 29, 2000 (KR) .............................. P2000-85557

(51) Int. Cl.
*G02F 1/1333* (2006.01)
(52) U.S. Cl. ....................................................... 349/54
(58) Field of Classification Search .................. 349/54
See application file for complete search history.

(56) References Cited

U.S. PATENT DOCUMENTS

| 5,060,036 A | * | 10/1991 | Choi | ........................... 257/350 |
| 6,072,550 A | * | 6/2000 | Kim | ............................. 349/54 |
| 6,184,948 B1 | * | 2/2001 | Lee | ............................. 349/54 |

FOREIGN PATENT DOCUMENTS

| GB | 2322967 A | * | 9/1998 |
| JP | 02010331 A | * | 1/1990 |

\* cited by examiner

*Primary Examiner*—Stephen W. Smoot
(74) *Attorney, Agent, or Firm*—McKenna Long & Aldridge LLP

(57) ABSTRACT

A liquid crystal display device, and its fabricating method, having a short-preventing structure. The liquid crystal display device includes a substrate having a first electrode. An insulating layer extends over the substrate and first electrode. A short-preventing member that extends over an edge of the first electrode is on the insulating layer. A multiple element metal pattern is on the insulating layer. The short-preventing structure prevents residual material from short circuiting the metal pattern elements.

21 Claims, 3 Drawing Sheets

LIQUID CRYSTAL DISPLAY HAVING A MEMBER FOR PREVENTING ELECTRICAL SHORTING

CROSS REFERENCES TO RELATED APPLICATIONS

This application claims benefit of Korean Patent Application No. P2000-85557, filed on 12 Dec. 2000, the entirety of which is hereby incorporated by reference for all purposes as if fully set forth herein.

BACKGROUND OF THE INVENTION

1. Field of the Invention

The present invention relates to liquid crystal display devices. More particularly it relates to reducing electrical shorts in liquid crystal display devices.

2. Background of the Related Art

Significant progress has been made in developing flat panel displays. In particular, liquid crystal display devices (hereinafter abbreviated LCDs) have proven beneficial because of their high contrast ratio, low power consumption, lightweight, and suitability for displaying moving images. Indeed, LCDs have become widely used substitutes for cathode ray tubes.

Generally, an LCD includes a thin film transistor (hereinafter abbreviated TFT) array on a lower substrate, an upper substrate having color filters, and a liquid crystal layer between those substrates. FIG. 1 shows a partial layout of a related art LCD, while FIG. 2 shows a cross-sectional view of that LCD along line I–I' of FIG. 1. The lower substrate 101 includes gate lines 102 (only one is shown) and data lines 105 (only one is shown) that intersect to form a matrix of unit pixels. A TFT is formed at the gate and data line 102 and 105 crossing. That TFT is formed by stacking a gate electrode 102a, a semiconductor layer 104, a source electrode 105a, and a drain electrode 105b. A pixel electrode 107 in the unit pixel area electrically connects to the drain electrode 105b.

The lower substrate 101 also includes a storage capacitor comprised of a lower electrode 102c, which is formed simultaneously with the gate line 102, and an upper electrode 105c, which is formed simultaneously with the data line 105. The storage capacitor maintains a voltage during a turn-off interval of the TFT.

The lower substrate 101 is beneficially fabricated by sputtering a low resistance metal layer on the substrate 101, and then by forming a gate pattern comprised of the gate line 102, the gate electrode 102a, and the lower electrode 102c by patterning that metal layer. A gate insulating layer 103 is then formed on the exposed surfaces, including on the gate pattern. The semiconductor layer 104 is then formed on the gate insulating layer 103 and over the gate electrode 102a.

Then, a data pattern comprised of the data line 105, source/drain electrodes 105a/105b, and the upper electrode 105c is formed by sputtering and patterning a metal layer over the exposed surfaces, including over the semiconductor layer 104. Ideally, except for the desired data pattern, the metal layer is completely removed. However, as shown in FIG. 2, sometimes metal residue 105d remains around the edges of the gate pattern.

The data pattern is beneficially formed by a wet etch process. Wet etching is performed by dipping the substrate 101 in a chemical solution, or by spraying a chemical solution on the substrate, so as to remove metal that is not protected by a photoresist. While generally successful, wet etching has problems. For example, edges of the data pattern can be over etched, or residue 105d can remain.

The residue 105 can electrically short the source electrode 105a and the drain electrode 105b, and/or the upper electrode 105c and the data line 105, together. This is shown in FIG. 1, where the source electrode 105a is electrically connected to the drain electrode 105b through residue 105d, and the upper electrode 105c is connected to a data line 105 through residue 105d'.

Subsequently, a thick passivation layer (not shown in FIG. 1 or FIG. 2) is formed over the substrate 101, including the data pattern. A pixel electrode 107 is then formed in the pixel area over the passivation layer, and in electrical contact with the drain electrode 105b.

The residue 105d (and 105d') can cause device failure. Therefore, a technique of preventing such failures would be beneficial.

SUMMARY OF THE INVENTION

Accordingly, the present invention is directed to a liquid crystal display device, and to a fabricating method thereof, that substantially obviates one or more of the problems due to limitations and disadvantages of the related art.

Additional features and advantages of the invention will be set forth in the description that follows, and in part will be apparent from that description, or may be learned by practice of the invention. The objectives and other advantages of the invention will be realized and attained by the structure particularly pointed out in the written description and claims hereof as well as the appended drawings.

To achieve these and other advantages, and in accordance with the principles of the present invention as embodied and broadly described, a liquid crystal display device according to the present invention includes a first substrate having a plurality of pixel areas, a second substrate confronting the first substrate, a plurality of first and second electrode patterns arranged on the first substrate, wherein an insulating layer is inserted between the first substrate and the first and second electrode patterns, a short-prevention member is formed at edges of the first electrode patterns so as to prevent electric shorts between second electrode pattern elements, a pixel electrode formed in each of the pixel areas, and a liquid crystal layer is disposed between the first and second substrates.

In another aspect, a method of fabricating a liquid crystal display device includes the steps of forming first electrode patterns on a first substrate; forming an insulating layer over the first substrate and the first electrode patterns; forming a short-prevention member over edges of the first electrode pattern; forming a second electrode pattern having a plurality of members; forming a pixel electrode in pixel areas, spacing a second substrate over the first substrate, and locating a liquid crystal layer between the first and second substrates. The short-prevention member inhibits residue from shorting second electrode pattern member together.

An advantage of the present invention is a reduction in the number of electric shorts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and which are incorporated in and which constitute a part of this specification, illustrate embodiments of the invention and together with the description serve to explain the principles of the invention.

In the drawings:

FIG. 5A to FIG. 5D show layouts of fabricating an LCD according to the principles of the present invention; and FIG. 6 shows a liquid crystal display according to the principles of the present invention.

DETAILED DESCRIPTION OF THE PREFERRED EMBODIMENT

Figure 1:
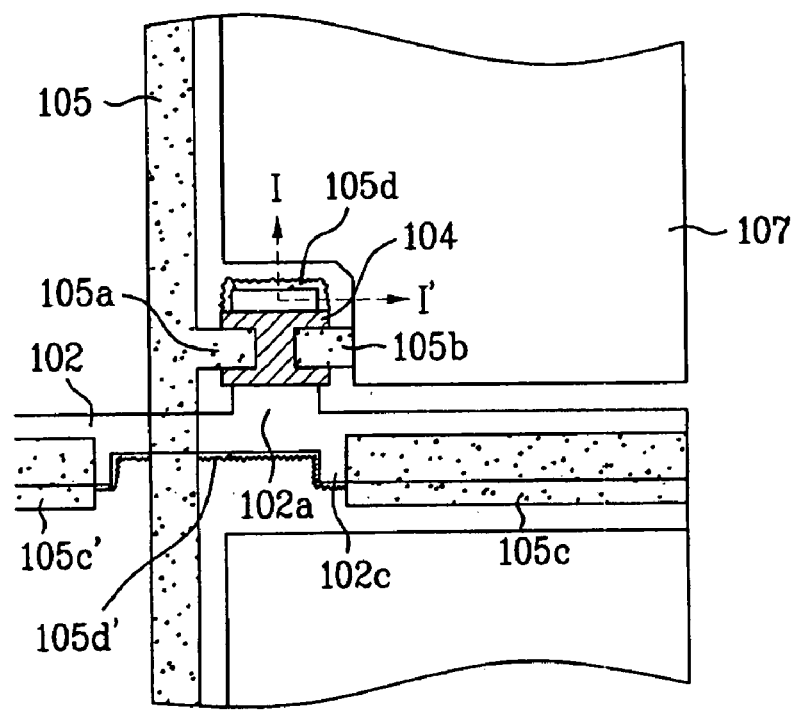
FIG. 1 shows a layout of an LCD according to a related art.
Figure 2:
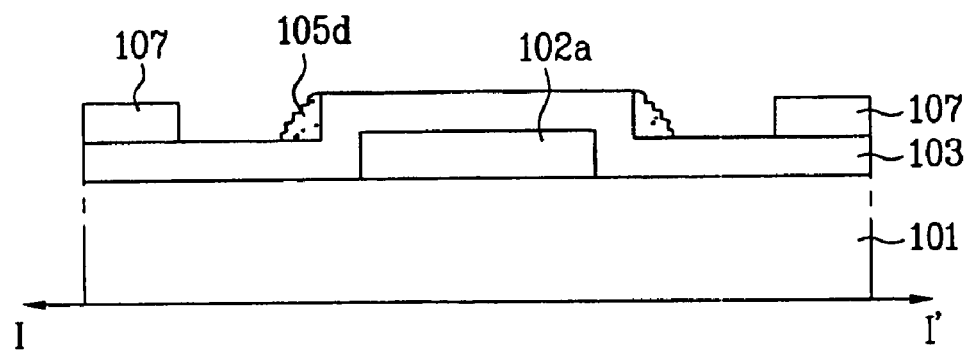
FIG. 2 shows a cross-sectional view of the related art LCD along line I–I' of FIG. 1.

The present invention is intended to reduce electrical short by forcing an opening in conductive residue. Beneficially, a short-prevention member and a semiconductor layer are patterned simultaneously so as not to increase the number of processing steps.

Reference will now be made in detail to a preferred embodiment of the present invention, which is illustrated in the accompanying drawings. Where possible, the same reference numerals will be used to illustrate like elements throughout the specification.

Figure 3:
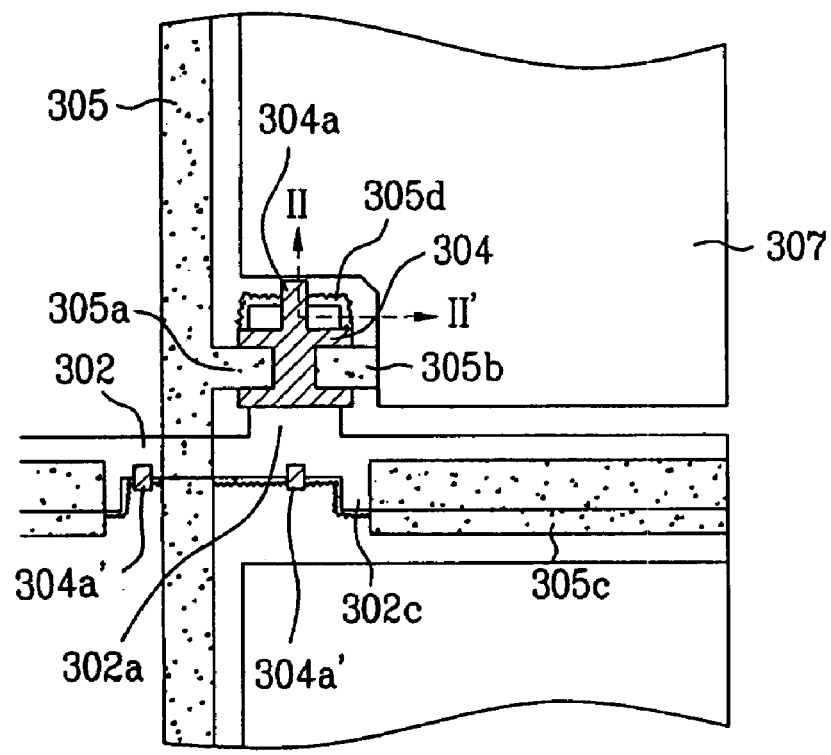
FIG. 3 shows a layout of an LCD according to the principles of the present invention.
Figure 4:
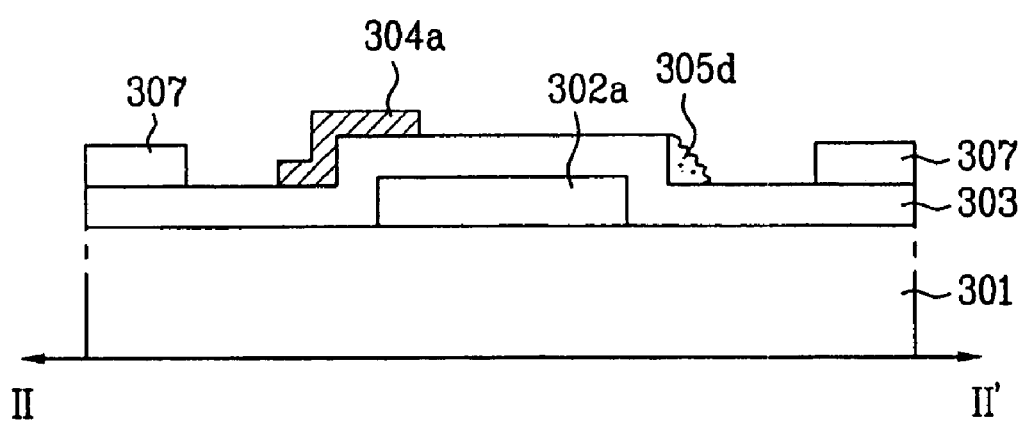
FIG. 4 shows a cross-sectional view of the LCD of FIG. 3 bisected along line II–II' of FIG. 3.

FIG. 3 shows an LCD according to the present invention, FIG. 4 shows a cross-sectional view of that LCD along line II–II' of FIG. 3, and FIG. 5A to FIG. 5D show schematic layouts when fabricating an LCD according to the present invention. The inventive LCD includes a first substrate, called a TFT arrangement substrate, a second substrate, called a color filter substrate, and a liquid crystal layer between the first and the second substrates. The TFT arrangement substrate is explained in more detail in the following description.

Referring now to FIG. 3 and FIG. 4, a TFT arrangement substrate in a liquid crystal display device according to the present invention includes a gate line 302, a gate electrode 302a, and a lower electrode 302c of a storage capacitor on a first substrate 301. A gate insulating layer 303 is then formed over the exposed surfaces, and a semiconductor layer 304 is formed on the gate insulating layer and over the gate electrode 302a. Short-prevention members 304a and 304a' for preventing electric shorts are formed simultaneously with the semiconductor layer 304. The short-prevention member 304a' is formed as an island.

A data line 305 that crosses the gate line 302 is then formed. The data line 305 and the gate line 302 define a unit pixel area. A source electrode 305a, a drain electrode 305b, and an upper electrode 305c of the storage capacitor are along with the data line 305. Then, a thick passivation layer (not shown in the drawings) is formed over the exposed surfaces. A pixel electrode 307 is then formed on the passivation layer, in the unit pixel area, and in electrical contact with the drain electrode 305b.

The lower electrode 302c and the upper electrode 305c constitute a storage capacitor, and the gate electrode 302a, the semiconductor layer 304, and the source/drain electrodes 305a/305b constitute a thin film transistor. The semiconductor layer 304 is beneficially amorphous silicon, thus the thin film transistor is beneficially an amorphous silicon thin film transistor (a-Si:H TFT).

Figure 5A:
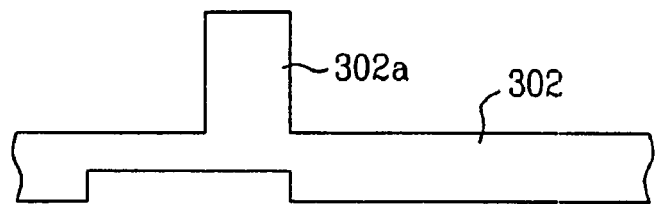

FIG. 5A to FIG. 5D show schematic layouts when fabricating an LCD according to the present invention. Referring now to FIG. 5A, a low resistance metal layer, such as Cr, Mo, Al, Sn, or Cu, is deposited on the substrate 301 by sputtering. A gate line 302 and a gate electrode 302a, as well as a lower electrode 302c are then simultaneously formed by photolithography. In the present embodiment, a portion of the gate line 302 is used as the lower electrode 302c.

As the gate line, gate electrode, and lower electrode of a capacitor are patterned by wet etch, the patterned edges can be over-etched such that the contour of those elements may not be precise.

Figure 5B:
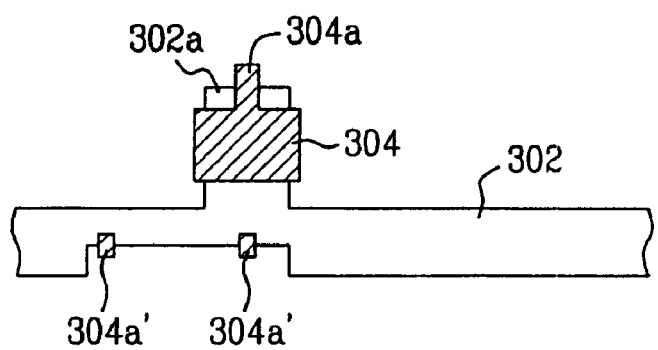

Referring now to FIG. 5B, after the gate insulating layer 303 has been formed over the exposed surface, including the gate electrode 302a, an amorphous silicon layer is deposited on the gate insulating layer 303 and over the gate electrode 302a. Then, a semiconductor layer 304 is defined by dry etching the amorphous silicon layer. Additionally, short-prevention members 304a and 304a' are formed on the gate insulating layer and over edges of the gate electrode 302a and gate line 302 when the semiconductor layer 304 is formed.

The overall fabrication process is not complicated when adding short-prevention members 304a and 304a' because the semiconductor layer 304 and the short-prevention members are formed simultaneously.

Figure 5C:
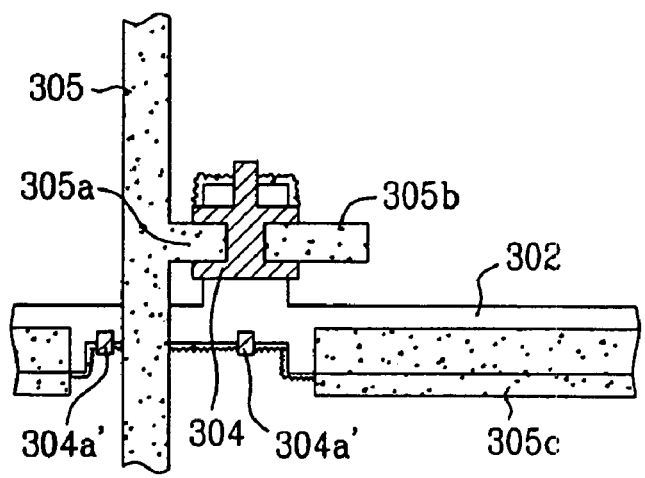

Referring now to FIG. 5C, a data line 305 that crosses the gate line 302, and thus defines a unit pixel, is then formed. Simultaneously, the source electrode 305a, the drain electrode 305b, and the upper electrode 305c are also formed. Those structures are formed by depositing a low-resistance metal, such as by sputtering, and then by performing photolithography using a wet etch process.

The short-prevention layer members 304a and 304a' induce opens in any metal residue 305d after etching the data line 305, the source/drain electrodes 305a/305b, and the upper electrode 305c. Accordingly, electrical paths along the metal residue 305d are broken, thus preventing electrical shorts.

Referring now to FIG. 5D, a thick passivation layer (which is not shown in the drawings for clarity) is formed over the exposed surfaces, including the data line 305. Then, an ITO (indium tin oxide) layer is deposited on the passivation layer. That ITO layer is then patterned via photolithography to produce a pixel electrode 307 that electrically connects to the drain electrode 305b.

Referring now FIG. 6, a liquid crystal display according to the principles of the present invention includes a TFT arrangement substrate 1 as described above, including the short-prevention layer members 304a and 304a', a second (color filter) substrate 400, and a liquid crystal layer 402 between the first substrate 1 and the second substrate 2. A spacer 404 maintains a constant separation between the substrate.

While FIG. 3 shows thin short-prevention members 304a and 304a', those members can be wide and can extend along edges of the gate line 302 or where residue can result. This enables prevention of electric shorts.

An LCD according to the present invention enables electric isolation of structures by forcing an opening in a conductive residue, thereby enhancing yields, without increasing the number of processing steps.

The foregoing embodiments are exemplary and are not to be construed as limiting the present invention. The principles of the present invention can be applied to other devices. Therefore, the foregoing description is intended to be illustrative, and not to limit the scope of the claims. Many alternatives, modifications, and variations will be apparent to those skilled in the art.

What is claimed is:

1. A liquid crystal display device comprising:
   a first substrate with a pixel area;
   a gate line on the first substrate, wherein the gate line includes an edge and a gate electrode;
   an insulating layer over the gate line;
   a data line over the insulating layer, wherein the data line includes at least two conductive members;
   a short-prevention member on the insulating layer, over the edge of the gate line and an edge of the gate electrode, and between the at least two conductive members; and
   a pixel electrode in the pixel area;
   wherein the short-prevention member prevents an electrical short circuit between the at least two conductive members caused by a residual material that is formed on the insulating layer.

2. The liquid crystal display device of claim 1, wherein the gate line includes a lower electrode of a storage capacitor.

3. The liquid crystal display device of claim 1, wherein the data line comprises a source electrode, a drain electrode and an upper electrode of a storage capacitor.

4. The liquid crystal display device of claim 1, wherein the insulating layer forms a gate insulating layer.

5. The liquid crystal display device of claim 4, further comprising:
   a gate electrode under the gate insulating layer;
   a semiconductor layer on the gate insulating layer and over the gate electrode; and
   source and drain electrodes over the semiconductor layer.

6. The liquid crystal display device of claim 5, wherein the short-prevention member is formed at a same time as the semiconductor layer.

7. The liquid crystal display device of claim 5, wherein the short-prevention member is comprised of a same material as the semiconductor layer.

8. The liquid crystal display device of claim 1, further comprising: a lower electrode; and an upper electrode, wherein the lower electrode and the upper electrode are separated by the insulating layer.

9. The liquid crystal display device of claim 1, wherein the short-prevention member is formed as an island.

10. The liquid crystal display device of claim 1, further including:
    a second substrate adjacent the first substrate; and
    a liquid crystal between the first substrate and the second substrate.

11. The liquid crystal display device of claim 1, further comprising a second short-prevention member.

12. The device of claim 11, wherein one of the short-prevention members is formed over an edge of the gate electrode.

13. A method of fabricating a liquid crystal display device, comprising:
    forming a gate line on a first substrate having a pixel area, the gate line including a gate electrode;
    forming an insulating layer over the first substrate and over the gate line;
    forming a short-prevention member on the insulating layer and over an edge of the gate line and an edge of the gate electrode;
    forming a data line on the insulating layer; and
    forming a pixel electrode in the pixel area;
    wherein the short-prevention member is disposed to prevent electric shorts in the data line.

14. The method of claim 13, wherein the gate line is formed using a wet etch process, and wherein the gate line includes a lower electrode of a storage capacitor.

15. The method of claim 14, further comprising:
    forming a gate electrode under the insulating layer;
    forming a semiconductor layer over the insulating layer; and
    forming source/drain electrodes over the semiconductor layer.

16. The method of claim 15, wherein the short-prevention member is formed of a same material as the semiconductor layer.

17. The method of claim 13, wherein the data line is formed using a wet etch process, and wherein the data line includes source/drain electrodes, and an upper electrode of a storage capacitor.

18. The method of claim 13, wherein the short-prevention member is formed as an island.

19. The method of claim 13, wherein the short-prevention member is formed by dry etching.

20. The method of claim 13, further comprising a second short-prevention member.

21. The method of claim 20, wherein one of the short-prevention members is formed over an edge of the gate electrode.

* * * * *